US008917530B2

(12) United States Patent
Soyata

(10) Patent No.: US 8,917,530 B2
(45) Date of Patent: Dec. 23, 2014

(54) PROBABILISTICALLY-BANKED CONTENT ADDRESSABLE MEMORY AND STORAGE

(71) Applicant: University of Rochester, Rochester, NY (US)

(72) Inventor: Tolga Soyata, Pittsford, NY (US)

(73) Assignee: University of Rochester, Rochester, NY (US)

( * ) Notice: Subject to any disclaimer, the term of this patent is extended or adjusted under 35 U.S.C. 154(b) by 61 days.

(21) Appl. No.: 13/747,166

(22) Filed: Jan. 22, 2013

(65) Prior Publication Data

US 2013/0188409 A1    Jul. 25, 2013

Related U.S. Application Data

(60) Provisional application No. 61/589,581, filed on Jan. 23, 2012.

(51) Int. Cl.
*G11C 15/00* (2006.01)
*G11C 15/04* (2006.01)

(52) U.S. Cl.
CPC ............... *G11C 15/00* (2013.01); *G11C 15/04* (2013.01)
USPC ....................................... 365/49.1; 365/49.16

(58) Field of Classification Search
CPC ....................................................... G11C 15/00
USPC ............................... 365/49.1, 49.16; 711/108
See application file for complete search history.

(56) References Cited

U.S. PATENT DOCUMENTS

2007/0115986 A1 * 5/2007 Shankara ....................... 370/392
2011/0055489 A1 * 3/2011 Reddy et al. .................. 711/141

OTHER PUBLICATIONS

Pagiamtzis, Kostas et al., "Content-Addressable Memory (CAM) Circuits and Architectures: A Tutorial and Survey," Mar. 2006, IEEE Journal of Solid-State Circuits, vol. 41, No. 3 (pp. 712-727).
ITRS, "International Technology Roadmap for Semiconductors: 2011," 2011, http://www.itrs.net/models,html/.
Agrawal, Banit et al., "Ternary CAM Power and Delay Model: Extensions and Uses," May 2008, IEEE Transactions on Very Large Scale Integration (VLSI) Systems, vol. 16, No. 5, (pp. 554-564).
El Baraji, Mourad et al., "Towards an ultra-low power, high density and non-volatile Ternary CAM," Nov. 2008 in Non-Volatile Memory Technology Symposium (NVMTS), Pacific Grove, CA (pp. 1-7).
Agrawal, Banit et al., "Modeling TCAM Power for Next Generation Network Devices," Mar. 2006, In Proceedings of IEEE International Symposium on Performance Analysis of Systems and Software (ISPASS) (pp. 1-10).
Bloom, Burton H., "Space/Time Trade-offs in Hash Coding with Allowable Errors," Jul. 1970, Communications of the ACM, vol. 13, No. 7 (pp. 422-426).

(Continued)

*Primary Examiner* — Hoai V Ho
(74) *Attorney, Agent, or Firm* — Harris Beach PLLC

(57) ABSTRACT

An energy-efficient CAM architecture provides increased speed of searching, reduced power consumption, or a tuned combination of increased speed of searching and reduced power consumption. The CAM comprises a plurality of CAM banks, a plurality of Bloom filters, each Bloom filter associated with a content addressable memory bank, each Bloom filter recording elements inserted into an associated content addressable memory bank, wherein the size of each Bloom filter is configured to reduce energy or power consumption of the content addressable memory apparatus. The size of each Bloom filter may be configured to reduce energy or power consumption of the content addressable memory apparatus.

9 Claims, 7 Drawing Sheets

(56) References Cited

OTHER PUBLICATIONS

Kirsch, Adam et al., "Building a Better Bloom Filter," 2005 Technical Report, Harvard University, Department of Computer Science, Division of Engineering and Applied Sciences.

Bonomi, Flavio et al., "An Improved Construction for Counting Bloom Filters," 2006 in 14th Annual European Symposium, ESA (pp. 684-695).

Broder, Andrei et al., "Network Applications of Bloom Filters: A Survey," 2004, Internet Mathematics, vol. 1, No. 4 (pp. 485-509).

Zhao, Wei et al., "Predictive Technology Model for Nano-CMOS Design Exploration," Apr. 2007 ACM Journal on Emerging Technologies in Computing Systems, vol. 3, No. 1, Article 1.

Broder, Andrei et al., "Using Multiple Hash Functions to Improve IP Lookups," Apr. 2001 in IEEE Infocom, Anchorage, Alaska (pp. 1454-1463).

Soyata, Tolga et al., "Synchronous Performance and Reliability Improvement in Pipelined ASICs," Sep. 1994, In Proceedings of the IEEE ASIC Conference (pp. 383-390).

Soyata, Tolga et al., "Monotonicity Constraints on Path Delays for Efficient Retiming with Localized Clock Skew and Variable Register Delay," May 1995, In Proceedings of the International Symposium on Circuits and Systems (pp. 1748-1751).

Soyata, Tolga et al., "COMBAT: mobile-Cloud-based cOmpute/coMmunications infrastucture for BATtlefield applications," Apr. 2012, SPIE Defense, Security, and Sensing 2009. Modeling and Simulation for Defense Systems and Applications VII, vol. 8403-20.

Soyata, Tolga et al., Cloud-Vision: Real-time Face Recognition Using a Mobile-Cloudlet-Cloud Acceleration Architecture, Jul. 2012 Capadocia, Turkey, In 17th IEEE Symposium on Computers and Communications (IEEE ISCC 2012).

Fahad, Amal et al., "SOLARCAP: Super Capacitor Buffering of Solar Energy for Self-Sustainable Field Systems," Sep. 2012 in 25th IEEE International System-on-Chip Conference.

\* cited by examiner

PRIOR ART Fig. 1

PRIOR ART

PROBABILISTICALLY-BANKED CONTENT ADDRESSABLE MEMORY AND STORAGE

CROSS-REFERENCE TO RELATED APPLICATIONS

This application claims the benefit of Provisional Application No. 61/589,581, filed Jan. 23, 2012, the contents of which are incorporated herein in their entirety.

BACKGROUND OF THE INVENTION

1. Field of the Invention

The present invention relates to an energy-efficient CAM architecture that provides increased speed of searching, reduced power consumption, or a combination of increased speed of searching and reduced power consumption.

2. Description of the Related Art

A Content Addressable Memory (CAM) facilitates search operations based on the content, rather than the physical location of the data. This allows for much faster database operations, such as insertion, deletion, and search. The speed improvement primarily comes from the ability to search multiple entries in parallel. Although the speed of the operation is improved, very large CAMs cannot be built due to energy and power limitations. This is due to the 100% activity factor CAMs have during their search operation. At some point, it becomes technologically infeasible to dissipate the amount of power required for the CAM. For example, some recent CAMs yield a 150 W power consumption projection for a 256 KB CAM, nearly at the limit of conventional cooling for any IC. Although sophisticated circuit design techniques, such as pipelining and banking can reduce this number to a smaller value, such as 50 W, it is still evident that a CAM in the order of Gigabytes is not feasible using today's technology.

CAMs provide the payload associated with a key. As an example, if one was to use a CAM to store zip codes and their associated city names, the key would be the city names, and the zip codes would be the payload (i.e., the result of the search). A conventional CAM is shown in FIG. 1, where the term tag is used interchangeably with the key. A traditional N-entry CAM searches all N elements in a single cycle to match a single key, thus performing N−1 wasteful searches. Therefore, this approach is very energy inefficient. One potential improvement is to use a conventional banked CAM structure as shown in FIG. 2, where the prefix of the data element (e.g., the MSB 4 bits) is used to pre-eliminate a large portion of the banks (e.g., 15). Only a single bank actually performs the query. This approach has a drawback: Since certain data elements can only reside in certain banks, the effective size of the CAM could be drastically reduced for non-uniformly distributed data elements (e.g., having a lot more city names that start with the letter M). This concept of not being able to place a certain entry into a certain bank is defined as a "bank conflict." This asymmetric distribution of the entries could eventually negate the savings from banking.

A variant of CAM, the ternary CAM (TCAM) stores each element in two bits, allowing three-valued (i.e., '0', '1', 'x') logical operations. This style CAM enables additional operations at the expense of storage area and power penalty. Due to the size limitation, CAM/TCAMs have been confined into a limited application space, such as, network routers, to perform packet classification and routing. In network router applications, much smaller (T)CAMs are needed and the search speed is of primary concern, reducing the negative impact of the high power consumption.

There has been considerable work in the area of CAM design to reduce the power and/or energy consumption of (T)CAMs. Although numerous techniques have been proposed to make CAMs more energy-efficient, the power savings have been limited, thereby significantly narrowing the application space of CAMs.

A need arises for an energy-efficient CAM architecture that provides increased speed of searching, reduced power consumption, or a combination of increased speed of searching and reduced power consumption. In addition, a need arises for a CAM architecture that reduces bank conflicts in a banked CAM.

SUMMARY OF THE INVENTION

The present invention provides an energy-efficient CAM architecture that provides increased speed of searching, reduced power consumption, or a tuned combination of increased speed of searching and reduced power consumption. This novel architecture, the probabilistically-banked Content Addressable Memory (pbCAM), achieves significant energy and power savings through the use of Bloom Filters by effectively decoupling data elements from their bank index. In addition, the pbCAM also eliminates an important hurdle in building large banked-CAMs: bank conflicts. The pbCAM design de-couples data values from their physical location, thereby permitting much larger CAMs to be constructed within the same power and/or energy budget.

For example, a content addressable memory apparatus comprises a plurality of content addressable memory banks, a plurality of Bloom filters, each Bloom filter associated with a content addressable memory bank, each Bloom filter recording elements inserted into an associated content addressable memory bank, wherein the size of each Bloom filter is configured to reduce energy or power consumption of the content addressable memory apparatus.

The size of each Bloom filter may be configured to reduce energy or power consumption of the content addressable memory apparatus by configuring at least one of: a number of bits per data entry in a content addressable memory bank, a per cycle Bloom Filter energy, a number of banks in the content addressable memory apparatus, a per bank content addressable memory apparatus energy per cycle, a false positive probability, and a the voltage reduction factor achieved due to lowering an operation frequency of the content addressable memory apparatus.

The size of each Bloom filter is configured to reduce energy or power consumption of the content addressable memory apparatus based on:

$$\text{CAMBE}*B >> B*\text{BFE} + \text{CAMBE}*(1+p*(B-1)))*V2,$$

$$\text{CAMBE}*B*(1-(V2*(1+p*(B-1)))) >> B*\text{BFE}, \text{ and}$$

$$\text{CAMBE}*(1-V2/B*(1+p*(B-1))) >> \text{BFE},$$

where BFE is a per cycle Bloom Filter energy, B is a number of banks of the content addressable memory apparatus, CAMBE is a per bank CAM energy per cycle, p is a false positive probability, and V2 is a voltage reduction factor achieved due to lowering the frequency and the voltage of a CAM bank per cycle.

BRIEF DESCRIPTION OF THE DRAWINGS

The details of the present invention, both as to its structure and operation, can best be understood by referring to the accompanying drawings, in which like reference numbers and designations refer to like elements.

DETAILED DESCRIPTION OF THE INVENTION

Figure 1:
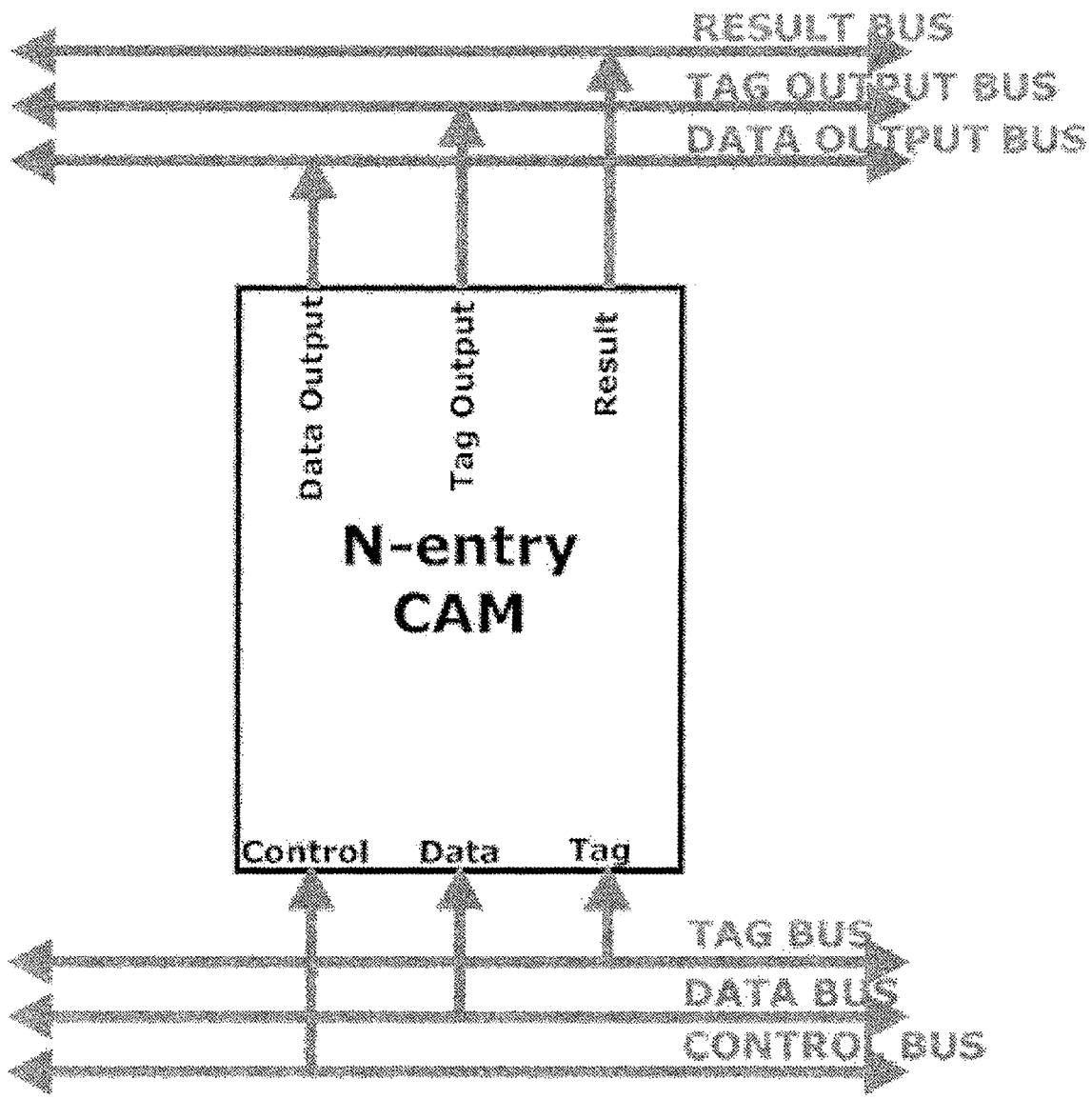
FIG. 1 is an exemplary block diagram of a conventional CAM.
Figure 2:
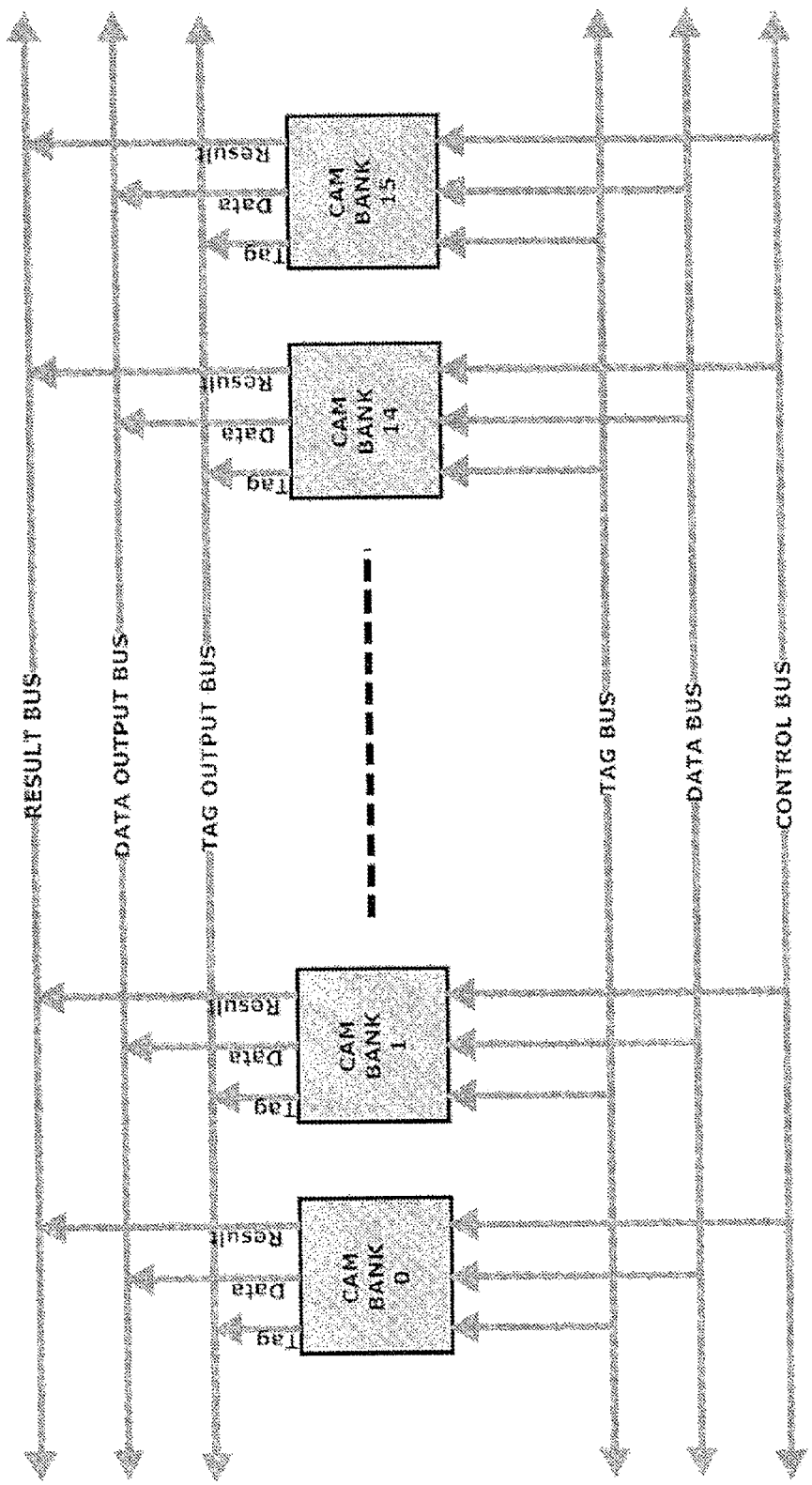
FIG. 2 is an exemplary block diagram of a conventional banked CAM.

The present invention provides an energy-efficient CAM architecture that provides increased speed of searching, reduced power consumption, or a tuned combination of increased speed of searching and reduced power consumption. This novel architecture, the probabilistically-banked Content Addressable Memory (pbCAM), achieves significant energy and power savings through the use of Bloom Filters by effectively decoupling data elements from their bank index. In addition, the pbCAM also reduces an important hurdle in building large banked-CAMs: bank conflicts. The pbCAM design de-couples data values from their physical location, thereby permitting much larger CAMs to be constructed within the same power budget.

Although banked CAMs reduce unnecessary searches, their power and speed benefits can be completely nullified by bank conflicts. To solve this issue, pbCAM uses a Bloom Filter (BF) at the input of each bank which records the new elements inserted into the corresponding bank. The BFs can later be queried for the existence of an element. They cause no false negatives, and have a false positive rate of p which can be reduced by making the filter size bigger.

Substituting some practical numbers, 1024 entry banks with a BF size of 8192 bits, and using 2 hash functions, $\epsilon=5\%$. In other words, if we use a BF to filter out the requests before even we send them into the CAM bank which has a 100% activity factor, we can determine if this bank has the entry or not with a 5% accuracy. Therefore, with a 95% chance, only one bank (the correct bank) will accept the query for a specific item, and 15 of them will reject it. With a 5% chance, we will have a false positive, i.e., two or more banks will accept the query and will compare it to their contents and will find that, it was a false positive.

A BF size of 8192 bits might seem extreme for a bank size of only 1024 entries. However, if we consider the fact that each entry is something like 64 b or 128 b wide, the comparison formula for energy consumption is $\quad$ CAMBE*$B$(for a conventional design), and $\quad$ CAMBE*$(1+p*(B-1))*V^2+B$*BFE, where b=number of bits per data entry in a bank, BFE=per cycle Bloom Filter energy, B=number of banks in the CAM design, CAMBE=per bank CAM energy per cycle, p=False positive probability, and V is the voltage reduction factor achieved due to lowering the operation frequency, and has a typical value between 1/B and 1, depending on the distribution of the elements into the banks. The multiplier $(1+p*(B-1))$ is introduced since $(1+p*(B-1))$ banks have to do work each cycle (i.e., one bank that actually has the element, and $p*(B-1)$ banks due to false positives. Alternatively, if each CAM bank is clocked at $(1+p*(B-1))/B$ times the frequency on average, the operation voltage of each bank can be reduced due to this lower frequency requirement, and each bank could consume less power according to the dynamic power dissipation formula: $CV^2f$. In other words, by scaling down V and f simultaneously to reduce the power consumption, a superlinear advantage can be obtained, which is characterized by the $V^2$ power factor.

The proposed design achieves lower energy consumption per cycle when $\quad$ CAMBE*$B$>>$B$*BFE+CAMBE*$(1+p*(B-1)))*V2$, $\quad$ CAMBE*$B$*$(1-(V2*(1+p*(B-1))/B)$>>$B$*BFE, and $\quad$ CAMBE*$(1-V2/B*(1+p*(B-1)))$>>BFE, where BFE is a per cycle Bloom Filter energy, B is a number of banks of the content addressable memory apparatus, CAMBE is a per bank CAM energy per cycle, p is a false positive probability, and V2 is a voltage reduction factor achieved due to lowering the frequency and the voltage of a CAM bank per cycle.

Choosing some exemplary numbers: p=0.05, a=1.5, B=16, V=0.8 {e.g., reduction of the operating voltage from 1V to 0.8V} ... CAMBE*0.93»BFE. Thus, for sufficiently high B values (heavily banked designs)→CAMBE>>BFE.

This analysis ignores the bus traffic, which can be integrated into the formula. However, it is clear that, this design offers a technique to trade-off BF energy for CAM energy. In particular, it is a lot easier to reduce BFE then CAMBE. For example, it is quite difficult to reduce CAMBE by pipelining due to the randomness of data elements being compared, it is easier to use appropriate hash functions to reduce BFE in a pipelined implementation. In other words, it is easier to "fail" a BF comparison at the early stages of the pipeline, rather than having to wait until the "middle" as would be the average case for pipelined CAMs.

Since BF is significantly more compact than the CAM bank itself and the data signals do not have to travel as far as they do with the CAM bank itself (i.e., they are at a close proximity to the bus), the comparison operation to the BF is more power efficient (i.e., bitline and matchline energies are a lot higher than the simple bus energy of BF).

Due to the extreme simplicity of the BF, the comparison operation can be designed to be (short-circuit based, i.e., stopping the operation in the middle when the answer is determined to be a NO, which is the higher probability case).

Although it is not possible to reduce the size of the CAM banks, it is possible to reduce the size of the BF to reduce energy, at the expense of higher false positives. We can design a "tiered" BF which consists of two (or more) serial BFs to reduce the energy. In other words, energy reductions are possible due to the "flexibility" in the design of the BF, which is a claim that cannot be made for CAM banks.

For 1024 entry banks, 64b each bank element, and an 8192b BF, even in the case of a simple BF design (using none of the optimizations above), there are only 8192 bits to compare in a BF, whereas there are 64*1024=64K elements to compare in the CAM bank, a savings of 8× energy.

All of these techniques will allow BFs to be around 10 to 100 times more energy efficient than the CAM bank itself, enabling a 10 to 100 times larger CAM to be built within the same power envelope.

Due to its flexibility in storage (i.e., not being restricted by a pre-index), storage of the CAM entries can be done in any bank. When a small portion of the CAM is being used, only a few of the banks can be kept full, further reducing the power and energy requirements by shutting off the unused CAM banks.

By using a TableID as a part of the Tag, multiple tables can be stored inside this proposed CAM without the need to allocate fixed areas in the CAM, i.e., any tag can be in any bank, allowing the stored tables to be any size with no restrictions as long as the total storage doesn't exceed the total CAM bank size.

Insertions to the CAM need to update the BF of the corresponding CAM bank So, the insertion energy is higher compared to a traditional design. However, bulk insertions, i.e., inserting 1024 entries can be employed to amortize this energy over multiple entries by bulk-calculating the final BF value, rather than calculating it one at a time.

Deleting entries from a CAM is extremely simple and are done by the 1) SEARCH FIRST, and 2) DELETE inside the bank that has the entry sequence. When an entry is deleted, the following actions can be taken related to the BF: o Doing nothing to the corresponding BF is a perfectly acceptable operation which will not affect correctness, but will increase the false positive rate, P, and, hence, the energy consumption for that bank. So, this is the optimal operation for databases with very minimal deletion activity.

For databases with heavy deletion activity, rebuilding the BF for that bank is an option, which will require going through all of the entries in the CAM banks that have deletions recorded. If the deletions have affected a lot of the banks, this operation could get very expensive energy-wise.

Completely invalidating one bank is very easy by simply zeroing every entry in its respective BF. This might require rethinking DB operations which utilize pbCAMs. For example, "Bulk deletions" or very "minimal deletions" may be two improved ways to use deletions, rather than "many deletions."

Using counting Bloom filters (CBF) with more than one bit per entry will almost completely eliminate the "many deletions" problem, at the expense of bigger BFs, which start cutting into the energy budget. Furthermore, using "saturating counters" for CBF entries might cause false negatives when the entry up-saturates and later down-saturates and reports a NO, where the entry exists (i.e., false negative).

Using a few banks with CBFs is a reasonable hybrid approach which restricts read-only data to the banks with BFs and RW data to the banks with CBFs.

Update is an easy operation, which involves changing the data associated with a tag. This operation requires the following sequence of actions: 1) Find the tag, 2) modify data in the CAM bank containing the tag, 3) do nothing to the BF, since the tag does not change, and BF is strictly updated based on the tag.

Figure 3:
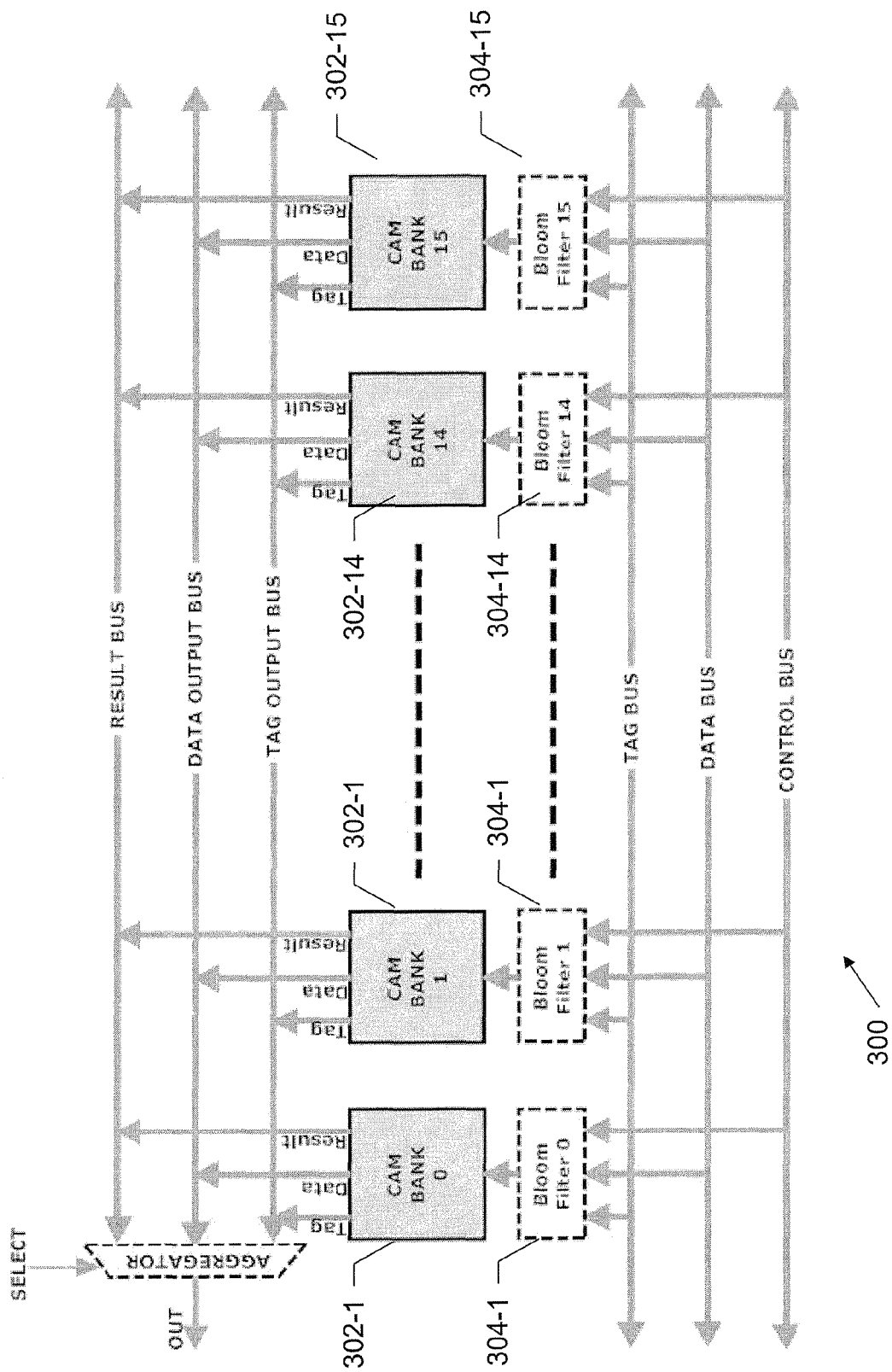
FIG. 3 is an exemplary block diagram of a pbCAM architecture.

An exemplary architecture of a pbCAM 300 is shown in FIG. 3. In this example, pbCAM 300 includes a plurality of CAM banks 302-0 to 302-15. Each CAM bank 302-0 to 302-15 has an associated BF 304-0 to 304-15, which records the new elements inserted into the associated bank.

The BF provides a tool for determining the existence of an entry in a dataset with a high probability. The most common BF has no false negatives, and a small false positive rate, p. The BF of a dataset is calculated by computing a hash function, H(D) on each data element D in the dataset and maintaining the aggregated result in the BF as the logical-OR of all of the H(D) values. By using k different hash functions (e.g., k=2), the false positive ratio can be decreased. As an example, assume that a data set contains three 16-bit entries, 6D34h, B3A5h, and 9A05h. Assume a hash function H( ), which, when applied to these data entries, yields 24-bit values as follows: H(6D34h)=080000h, H(B3A5h)=004000h, H(9A05h)=100000h. The resulting BF for these three data elements can be calculated by the logical OR of these three hash values, i.e., BF(D)=184000h.

In this example, in order to perform a search for a certain data element Q which has a hash value of, say, H(Q)= 000100h, since the BF is 184000h, this signals a guaranteed FALSE, which means that the data element does not exist in the dataset. This is determined by examining the individual bits of the H(Q) and the corresponding bits of BF. For each 1 bit of the H(Q), if the corresponding BF bit is 0, the element is guaranteed to be absent, otherwise, either the data element exists, or a false positive is being signaled by the BF. For an N-element dataset, a m-bit BF, the maximum false positive rate can be approximated by the following formula:

$$p = \left(1 - e^{\frac{-k(N + 0.5)}{m - 1}}\right)^k \quad (1)$$

where k is the number of different hash functions, assuming a uniform distribution of the storage elements. As the BF length (m) increases, the false positive probability decreases. This structure is used in the pbCAM design, where the existence of a data element will be tested using a Bloom filter before the query is performed.

Assuming an exemplary 16-bank (B=16) CAM using a 8192-bit BF for each bank (m=8192) and 2 hash functions (k=2). The false positive rate is p=5% from Equation 1. By sifting the queries using this BF before they reach the bank, one can ascertain if this bank contains the entry or not with a 0% false negative, and a 5% false positive ratio. Using this BF, one bank (the one actually containing the entry) will correctly accept the query and the other 15 banks will erroneously accept the query with a 5% probability, yielding an average activity factor of $$\frac{1 + p(B - 1)}{B}$$

(≈0.11 in this example), instead of the ideal $$\frac{1}{B}(\approx 0.06).$$

These spurious (p(B−1)) searches consume energy without benefit. However, reducing these extra queries requires a larger BF (i.e., higher m) according to Equation 1, thereby increasing the die area, and eventually increasing the energy consumption. This intricate relationship between m and p affords pbCAM a design freedom to trade-off die area against energy consumption, creating a unique opportunity that doesn't exist in traditional banked CAMs.

pbCAM has the ability to store a data element in any bank without restrictions using an appropriate hash function which decouples the D from the H(D). Such hash functions are common, especially in cryptography (i.e., crypto-strength hash functions), where one of the important design param eters is the independence of the output of a hash function from its input. Achieving a uniform activity level of $$\frac{1+p(B-1)}{B}$$

in each pbCAM bank creates an opportunity to reduce the operation frequency of each bank by a factor of $$\frac{1+p}{B}.$$

This frequency reduction, combined with a voltage reduction, yields super-linear energy savings in the pbCAM design.

One key observation in the design of pbCAM is that the hash function of a data element being searched, H( ), needs to be calculated only once which can be used by every bank. Therefore, for a synchronous pipelined CAM IC that is processing s queries per second, s Hash calculations per second are necessary, which can be done at the main entry point of the CAM before the query reaches the pbCAM banks H(D) will be required by the Bloom Filter (BF) of every bank to determine whether there is a pre-match, but, the actual corresponding data D will only be required by the bank that contains the element, as well as the banks that issued a false positive match signal. This indicates that, the design of the H( ) function calculator can be decoupled from the Bloom filter itself as well as the pre-match circuitry. These separate elements are described below.

Figure 4:
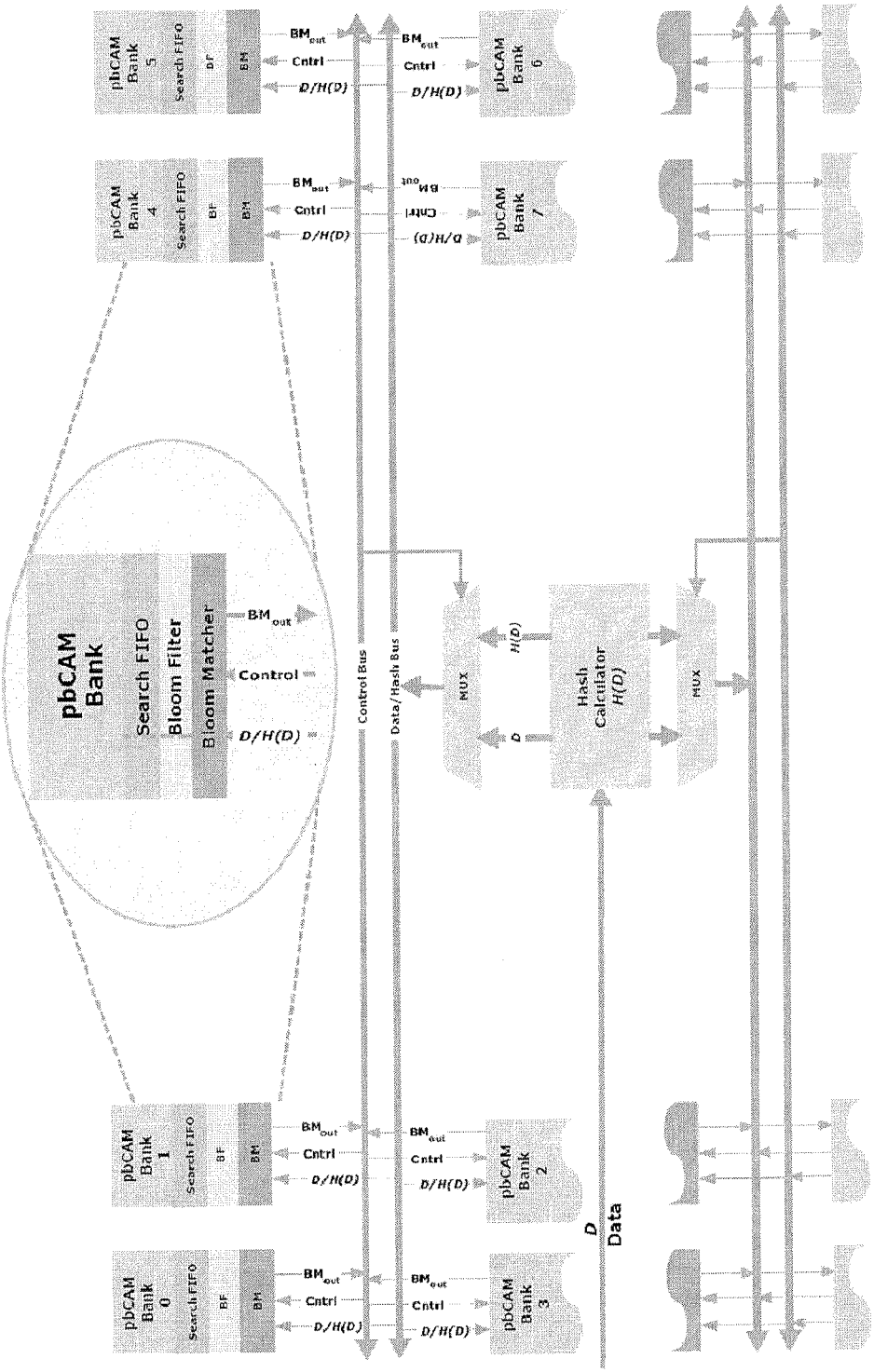
FIG. 4 is an exemplary block diagram of a pbCAM bank layout structure.

Although it is possible to partially pre-eliminate searches by using the initial few bits of the data, this type of pre-elimination using the actual data itself proves to be a weak filter due to the necessity of forcing certain data elements into pre-determined banks Rather, the BF based approach of pbCAM places no restriction on where each data element can reside due to the hashing. Since, based on our design, each data element only needs to be hashed once, the hash function can be chosen with primary focus on its energy consumption. Furthermore, using multiple hash functions provides design alternatives to trade-off false positives against Bloom filter size based on Equation 1. FIG. 4 depicts an exemplary pbCAM design with B=16. The entire CAM is designed to have only a single Hash calculator which derives H(D) from D right at the synchronous input of the pbCAM. This provides significant energy savings. The pbCAM is assumed to work at a frequency of $f_{CAM}$ which is the clock rate of the Hash calculator. Since CAM banks work at a significantly lower rate than $f_{CAM}$, with a theoretical best case of $$\frac{f_{CAM}}{B}$$

at p=0, and a theoretical worst case of $f_{CAM}$ (at an average p=1), and an expected rate or $$f_{CAM}\frac{1+p}{B},$$

the data (D) and hash values (H(D)) can be multiplexed on the internal CAM data bus without disrupting the overall CAM throughput.

Multiplexing of the H(D) and D values is achieved by sequentially placing the H(D) values on the data bus followed by the D value for the banks that responded positive to the pre-Bloom filter match. Each bank's BF outputs a match/no match flag on their BMout through the control bus, requesting the search data D. Banks that respond FALSE to the BF match simply ignore this search entry, waiting for the next H(D) value in the next cycle. Note that, accepting a search entry does not exempt a bank from listening to the next request. It is possible that, two or more entries in a row cause a hit in the same bank. In the worst case, B entries in a row cause a hit, forcing that bank to increase its frequency dynamically, towards $f_{CAM}$. Alternatively, in the best case, when every bank gets a hit uniformly, each bank can slow down to a frequency of $$f_{CAM}\frac{1+p}{B},$$

while still achieving a global CAM throughput of $f_{CAM}$.

Figure 5:
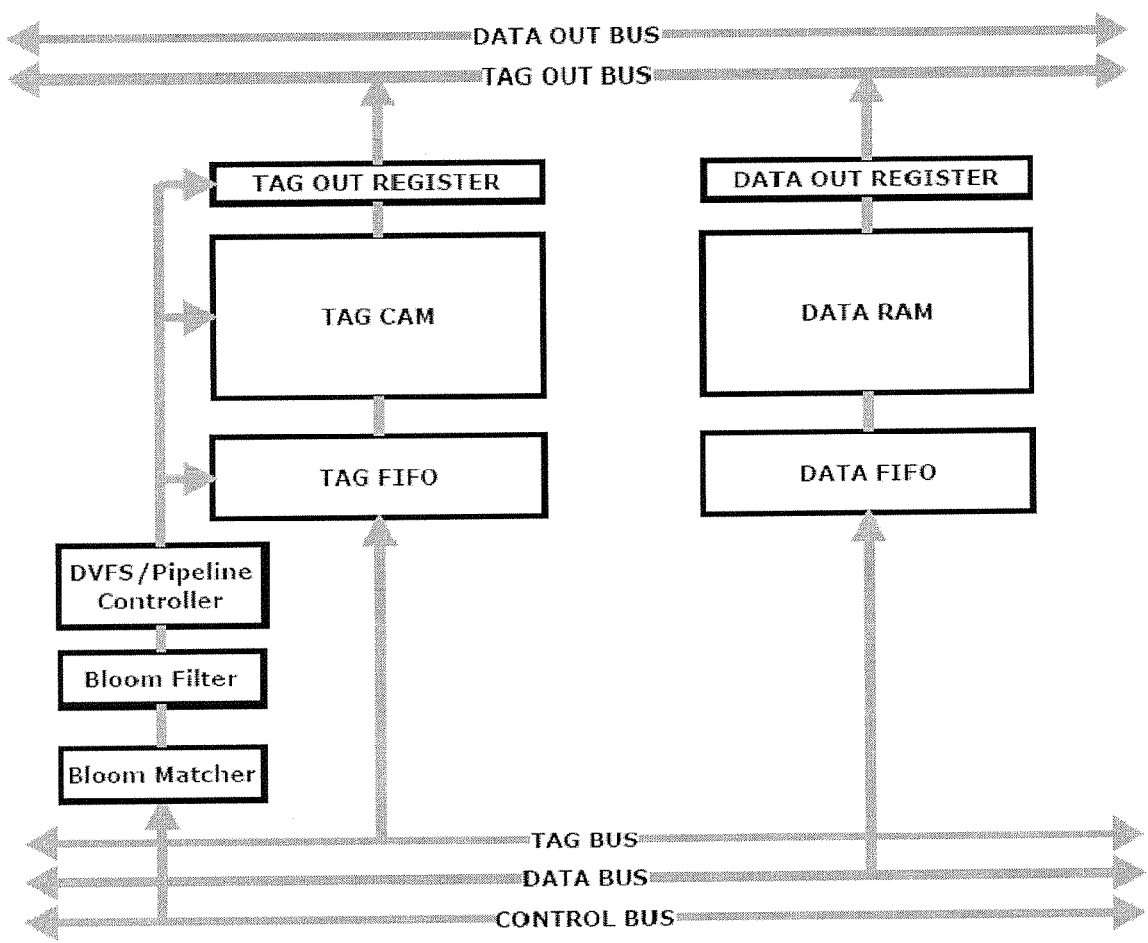
FIG. 5 is an exemplary block diagram of a micro-architecture of a pbCAM bank

An exemplary micro-architecture of a pbCAM bank is shown in FIG. 5. Insertion, deletion, and update requests are queued up in the TAG FIFO and Data FIFO, only if the BF responds positive. Otherwise they are discarded by this bank. This design allows the CAM bank to dynamically adjust its frequency between $f_{CAM}(1+p)$ B and $f_{CAM}$. The pipeline control can take advantage of Dynamic Voltage and Frequency Scaling (DVFS) to translate lower frequencies into a super-linear energy advantage by reducing the frequency and the voltage of the pipeline simultaneously. The output of the results are queued up at the TAG OUT and DATA OUT registers for the aggregator to combine them.

The total energy that is expanded in a naive design is $E_{CB} \times B$ per cycle, where $E_{CB}$ is the search energy of each CAM bank and B is the number of banks. The total energy per cycle in the proposed pbCAM is approximated by $$E_{pbCAM} = E_{CB}(1+p(B-1)) \times R_F^{\infty} B \times E_{BF} \qquad (2)$$

where RF is the reduction in frequency, and is a value between 1 and 2, signifying the super-linear energy savings due to simultaneous frequency and voltage reduction. EBF is the energy consumed by each bank's BF, and p is the false positive probability. The pbCAM achieves lower energy consumption per cycle when the following constraints are met:

$$E_{CB} \times B > E_{CB}(1+p(B-1)) \times R_F^{\infty} + B \times E_{BF} \qquad (3)$$

$$E_{CB}(B-(1+p(B-1)) \times R_F^{\infty}) + B \times E_{BF}$$

$$E_{CB}\left(1 - \frac{(1+p(B-1))R_F^{\infty}}{B}\right) > E_{CB}$$

Substituting typical exemplary numbers, p=0.05, a=1.5, $R_F \approx 0.11$, and B=16, we obtain nearly an order-of-magnitude energy savings for pbCAM as compared to the traditional CAM, which will also be demonstrated through our simulations. This analysis ignores the bus traffic, which can be integrated into the formula. However, it is clear that this design offers a methodology to trade-off BF energy for CAM bank energy.

The pbCAM performs a number of operations, such as Insertion, Deletion, and Search. Regarding the Insertion operation, this operation is performed by calculating the hash value H(D) of a data element D and inserting it into the selected pbCAM bank and updating the valid bit of the corresponding entry in that bank After the insertion into the bank, the BF of the selected bank is updated as follows:

$$BF^{t+1}[n]=BF^{t}[n]+H(D) \quad (4)$$

where + is the logical OR operation, and BF[n]t and BF[n]t+1 are the stored Bloom Filter values of bank n at the synchronous clock edge t and t+1, i.e., before and after the insertion, respectively. Note the saturation nature of the Bloom filter, where at each update, the selectivity of the Bloom filter decays exponentially according to Equation 1. The insertion of a data element, D, into the pbCAM can be performed simply inserting it into the first available bank in a Round-Robin fashion, and updating the BF of the bank according to Equation 4. However, this approach does not take full advantage of the features of pbCAM: 1) since pbCAM decouples data elements from the bank index, this feature can be exploited by an intelligent centralized controller to uniformly distribute the data elements into pbCAM banks, resulting in an effectively larger BF, 2) the same intelligent central control can also be used to pre-calculate the resulting Bloom Filter for all available B banks and choose the bank that causes the lowest bit-flips, thereby lowering the probability of Bloom Filter saturation, again, effectively, increasing m, 3) insertion can be performed into the least polluted bank, thereby improving the effectiveness of the BFs. The pollution concept will be explained below when deletions are described. It is to be noted that there is a large number of options enabled by different insertion policies. The present invention contemplates application to any and all such insertion policies.

Regarding, Deletion, despite its significant energy savings, the Bloom filter presents significant challenges in performing deletions. Since the logical OR function used to update the insertions into the BFs is a one-way function, deletions are not possible without significant ramifications in pbCAM operation. Simply flipping the 1's into 0's in the BF after a deleted element will introduce false negatives, which contradicts many of the assumptions that allowed the pbCAM to work efficiently. There are multiple ways to handle deletions with different trade-offs. Examples include: 1) Doing nothing, which will increase the effective false positive rate of the associated BF, albeit with zero impact on correctness of the pbCAM, 2) Maintaining a dirty counter, and not changing the BF. The increase in the false positive rate could be overcome by eventually flushing the BF and reconstructing it.

Regarding Search, the search operation is performed by comparing the hash value of a data element H(D) to the Bloom filter of the bank being searched. For k hash functions, there are only k logic 1's in the hash value of H(D). This presents interesting energy-savings alternatives for designing the search circuitry. The search operation is performed as follows:

$$Match'[n]=H'(D) \cdot BF[n] \quad (5)$$

where • is the bitwise logical OR operation, H'(D) is the bitwise logical inverse of H(D) and BF[n] is the Bloom filter value of bank n. If the result is TRUE (i.e., Match[n]=non-zero), either the bank contains the element, or the answer is a false positive.

Figure 6:
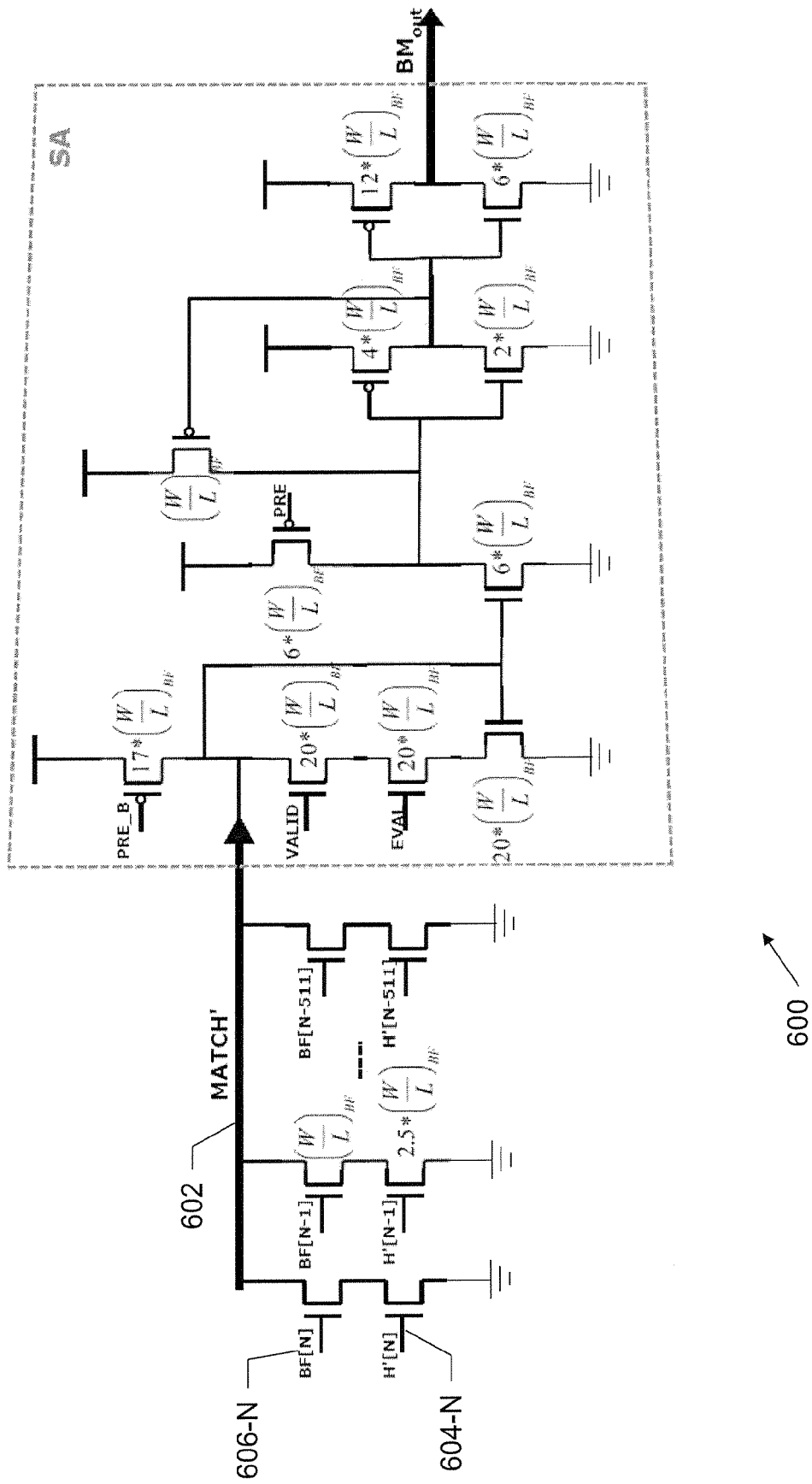
FIG. 6 is an exemplary circuit diagram of a Bloom Match circuit.

Regarding the Bloom Matcher and Bloom Filter, it can be seen from Equation 5 that, for each logic 1 bit of the Bloom filter, if even a single corresponding H(D) bit is zero, this bank does not contain the entry. An example of the design of a dynamic-NAND gate Bloom Match circuit 600 is shown in FIG. 6. Bloom Match circuit 600 determines the Match' 602 value by pre-charging the Match' 602 line and letting the hash value, such as 604-N, pull it down based on the BF value. The Bloom Filter may be constructed simply by using an SRAM array of m bits. These BF[n] bits are applied to the top transistor of the matching circuit to speed up the match process. Since the only transistor that suffers from source degeneration is the top transistor, by applying the steady BF value to the top transistor, the overall match speed is improved by almost completely eliminating the charge/discharge time of the top transistor. The BF value is updated only after an insertion which potentially changes certain BF bits, immediately updating the state of the top transistor, thereby nearly doubling the response time of the match circuit.

In this example, a sense amplifier (SA) 608 is included. This exemplary SA 608 is a typical current-race implementation. Although a more energy efficient SA can be designed for this specific application, the SA utilized for the CAM design described below is re-used in this example. In another implementation, the BF layout may be constrained by the CAM layout and, therefore, it may be advantageous to re-use components wherever feasible.

An important advantage of the present invention is its energy and power usage reduction potential. In order to demonstrate the energy reduction potential of the pbCAM architecture, a 64-entry×80-bit CAM schematic was designed and simulated in SPICE using PTM (Predictive Technology Model) files. Cadence tools were utilized; specifically, Virtuoso for the schematic realization and AMS and Spectre for the simulations. Four technology nodes were targeted: 65 nm, 45 nm, 32 nm, and 22 nm. RC-based interconnect models are included in the CAM design and the RC interconnect resistance and capacitance values specified by FIRS are used in the simulations.

The primary objective of the simulations is to extract $E_{CB}$ (CAM bank energy per cycle) and $E^{BF}$ (i.e., BF energy per cycle). At each technology node, three different power supplies were investigated: a high-performance value (HV), a nominal value (NV), and an 80% of nominal value (LV). The clock period is consistent throughout the simulations and is defined by the limiting case or from the LV power supply at the 65 nm technology node. ECB is the sum of the precharge energy and the evaluation energy. These values can be further parsed into the bit-line and sense-amplifier (SA) energies. For the scope of this paper, only the resulting total energy is reported. From the discussion above, the worst-case CAM energy is consumed when the activity factor is 100%, i.e., when every bank is queried every clock cycle. For this instance, the HV supply value is requisite. On the other hand, if the queries are being properly filtered via the BF/BM circuitry, the LV power supply may be utilized.

Table I details a juxtaposition of a typical CAM energy consumption versus that of the proposed Bloom Filter-driven, pbCAM energy consumption.

TABLE I

COMPARISON OF CAM VS. PBCAM ENERGY AT DIFFERENT TECHNOLOGY NODES AND DIFFERENT SUPPLY VOLTAGES (HV, NV, LV).

| Technology Node | | 65 nm (fJ) | 45 nm (fJ) | 32 nm (fJ) | 22 nm (fJ) |
|---|---|---|---|---|---|
| $E_{CB}$ | @ LV | 19,996 | 13,675 | 4,557 | 2,389 |
| | @ NV | 37,274 | 31,755 | 11,756 | 6,170 |
| | @ HV | 62,048 | 49,543 | 22,481 | 12,338 |
| $E_{BF}$ | | 347 | 182 | 162 | 104 |
| $E_{CAM}$ | @ LV | 319,936 | 218,800 | 72,912 | 22,224 |
| | @ NV | 596,384 | 508,080 | 188,096 | 98,720 |
| | @ HV | 992,768 | 792,688 | 359,696 | 197,400 |
| | WC | 114,138 | 89,610 | 41,938 | 23,249 |

TABLE I-continued

COMPARISON OF CAM VS. PBCAM ENERGY AT
DIFFERENT TECHNOLOGY NODES AND
DIFFERENT SUPPLY VOLTAGES (HV, NV, LV).

| Technology Node | | 65 nm (fJ) | 45 nm (fJ) | 32 nm (fJ) | 22 nm (fJ) |
|---|---|---|---|---|---|
| $E_{pbCAM}$ | nom | 44,378 | 30,443 | 12,187 | 6,714 |
| | BC | 40,548 | 26,841 | 10,571 | 5,838 |

The 64-entry×80-bit CAM is evaluated at each technology node and at each aforementioned supply voltage. The BF circuit shown in FIG. 6 is also simulated in the same fashion. The results of this investigation are posted in the first four rows of the table. As one would expect, the energy consumption scales with both technology and power supply voltage. The BF, in many cases, is over two orders of magnitude more energy efficient than the CAM bank Using the example given above, where B=16 and p=0.05, the rest of the table is populated. $E_{CAM}$ is $B \times E_{CB}$(@HV) and is considered the worst-case energy consumption of a standard CAM architecture. However, the worst-case implementation of the pbCAM is $B \times E_{BF} + 1.75 \times Ec_B$(@HV). The inclusion of the BF reduces the worst-case CAM activity factor from $$\frac{16}{16} \text{ to } \approx \frac{1.75}{16},$$

thereby translating to significant energy gains. A more realistic case is that given by $E_{pbCAM}$ column. For this deployment and given an expected false positive rate of 5%, from the discussion in Section III, one would expect CAM banks to operate at the NV 10% of the time; at the HV 5% of the time; and at the LV 60% of the time, resulting in an aggregate energy consumption reported in the nom row on Table I. The best case results (i.e. the last row of Table I) are only marginally better than for the expected nominal case. In both the nom and BC cases in the last two rows of Table I, most of the pbCAM activity is performed at the LV supply, which dictates this energy characteristic. This analysis shows that by filtering the data queries appropriately, an order-of-magnitude energy savings may be realized at each technology node.

Figure 7:
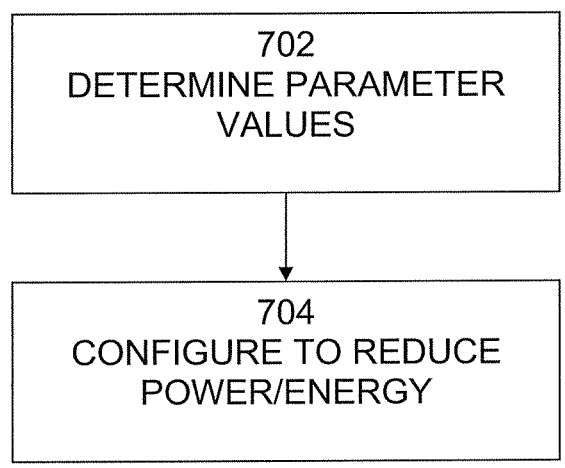
FIG. 7 is exemplary flow diagram of a process of designing a content addressable memory apparatus.

An exemplary flow diagram of a process 700 of designing a content addressable memory apparatus is shown in FIG. 7. Process 700 begins with step 702, in which values of parameters related to power consumption of the content addressable memory apparatus are determined so as to reduce energy or power consumption of the content addressable memory apparatus. The parameters may include parameters such as a number of bits per data entry in a content addressable memory bank, a per cycle Bloom Filter energy, a number of banks in the content addressable memory apparatus, a per bank content addressable memory apparatus energy per cycle, a false positive probability, and a the voltage reduction factor achieved due to lowering an operation frequency of the content addressable memory apparatus. These parameters may be determined based on:

$$CAMBE*B >> B*BFE + CAMBE*(1+p*(B-1)))*V2,$$

$$CAMBE*B*(1-(V2*(1+p*(B-1))/B) >> B*BFE, \text{ and}$$

$$CAMBE*(1-V2/B*(1+p*(B-1))) >> BFE,$$

where BFE is a per cycle Bloom Filter energy, B is a number of banks of the content addressable memory apparatus, CAMBE is a per bank CAM energy per cycle, p is a false positive probability, and V2 is a voltage reduction factor achieved due to lowering the frequency and the voltage of a CAM bank per cycle.

In step 704, the size of each Bloom filter is configured to reduce energy or power consumption of the content addressable memory apparatus based on the determined parameters. The content addressable memory apparatus comprises a plurality of content addressable memory banks and a plurality of Bloom filters, each Bloom filter associated with a content addressable memory bank, each Bloom filter recording elements inserted into an associated content addressable memory bank.

It is important to note that while aspects of the present invention have been described in the context of a fully functioning data processing system, those of ordinary skill in the art will appreciate that the processes of the present invention are capable of being distributed in the form of a computer program product including a computer readable medium of instructions. Examples of non-transitory computer readable media include storage media, examples of which include, but are not limited to, floppy disks, hard disk drives, CD-ROMs, DVD-ROMs, RAM, and, flash memory.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A content addressable memory apparatus comprising:
   a plurality of content addressable memory banks;
   a plurality of Bloom filters, each Bloom filter associated with said content addressable memory bank, each Bloom filter recording elements inserted into an associated content addressable memory bank; and
   a FIFO (first in first out) data buffer, controlled by a dynamic voltage and frequency scaling (DVFS) pipeline controller operatively coupled to each content addressable memory bank of said plurality of content addressable memory banks, said dynamic voltage and frequency scaling pipeline controller adapted to dynamically adjust substantially simultaneously said frequency and said voltage of said plurality of content addressable memory banks in response to one or more parameters to reduce a power and energy consumption of said content addressable memory apparatus.

2. The content addressable memory apparatus of claim 1, wherein said content addressable memory apparatus is configured to reduce energy or power consumption of the content addressable memory apparatus by configuring at least one of: a number of bits per data entry in said content addressable memory bank, a per cycle Bloom Filter energy, a number of active banks in the content addressable memory apparatus, a per bank content addressable memory apparatus energy per cycle, a false positive probability, said voltage of said content addressable memory apparatus and said frequency of said content addressable memory apparatus.

3. The content addressable memory apparatus of claim 1, wherein said content addressable memory apparatus is configured to reduce energy or power consumption of the content addressable memory apparatus based on:

$$CAMBE*B >> B*BFE + CAMBE*(1+p*(B-1)))*V2,$$

$$CAMBE*B*(1-(V2*(1+p*(B-1))/B) >> B*BFE, \text{ and}$$

$$CAMBE*(1-V2/B*(1+p*(B-1))) >> BFE,$$

where BFE is a per cycle Bloom Filter energy, B is a number of banks of the content addressable memory apparatus, CAMBE is a per bank CAM energy per cycle, p is a false positive probability, and V2 is a voltage reduction factor achieved due to lowering the frequency and the voltage of a CAM bank per cycle.

4. An integrated circuit comprising:
a content addressable memory apparatus comprising: a plurality of content addressable memory banks;
a plurality of Bloom filters, each Bloom filter associated with said content addressable memory bank, each Bloom filter recording elements inserted into an associated content addressable memory bank; and
a FIFO data buffer, controlled by a dynamic voltage and frequency scaling pipeline controller operatively coupled to each content addressable memory bank of said plurality of content addressable memory banks, said dynamic voltage and frequency scaling pipeline controller adapted to dynamically adjust substantially simultaneously said frequency and said voltage of said plurality of content addressable memory banks in response to one or more parameters to reduce a power and energy consumption of said content addressable memory apparatus.

5. The integrated circuit of claim 4, wherein said content addressable memory apparatus is configured to reduce energy and power consumption of the content addressable memory apparatus by configuring at least one of: a number of bits per data entry in said content addressable memory bank, a per cycle Bloom Filter energy, a number of active banks in the content addressable memory apparatus, a per bank content addressable memory apparatus energy per cycle, a false positive probability, said voltage of said content addressable memory apparatus and said frequency of said content addressable memory apparatus.

6. The integrated circuit of claim 4, wherein said content addressable memory apparatus is configured to reduce energy or power consumption of the content addressable memory apparatus based on:

$$CAMBE*B >> B*BFE+CAMBE*(1+p*(B-1)))*V2,$$

$$CAMBE*B*(1-(V2*(1+p*(B-1))/B) >> B*BFE, \text{ and}$$

$$CAMBE*(1-V2/B*(1+p*(B-1))) >> BFE,$$

where BFE is a per cycle Bloom Filter energy, B is a number of banks of the content addressable memory apparatus, CAMBE is a per bank CAM energy per cycle, p is a false positive probability, and V2 is a voltage reduction factor achieved due to lowering the frequency and the voltage of a CAM bank per cycle.

7. A method for operating a content addressable memory apparatus comprising:
providing a plurality of content addressable memory banks and a plurality of Bloom filters, each Bloom filter associated with said content addressable memory bank, each Bloom filter recording elements inserted into an associated content addressable memory bank, and a FIFO data buffer, controlled by a dynamic voltage and frequency scaling pipeline controller operatively coupled to each content addressable memory bank of said plurality of content addressable memory banks;
determining values of parameters related to energy or power consumption of the content addressable memory apparatus to reduce energy or power consumption of the content addressable memory apparatus; and
dynamically adjusting substantially simultaneously said frequency or said voltage of said content addressable memory banks in response to one or more of said values of parameters to reduce the energy or power consumption of said content addressable memory apparatus.

8. The method of claim 7, wherein the parameters include at least one of: a number of bits per data entry in said content addressable memory bank, a per cycle Bloom Filter energy, a number of active banks in the content addressable memory apparatus, a per bank content addressable memory apparatus energy per cycle, a false positive probability, said voltage of said content addressable memory apparatus and said frequency of said content addressable memory apparatus.

9. The method of claim 7, wherein the parameters are determined based on:

$$CAMBE*B >> B*BFE+CAMBE*(1+p*(B-1)))*V2,$$

$$CAMBE*B*(1-(V2*(1+p*(B-1))/B) >> B*BFE, \text{ and}$$

$$CAMBE*(1-V2/B*(1+p*(B-1))) >> BFE,$$

where BFE is a per cycle Bloom Filter energy, B is a number of banks of the content addressable memory apparatus, CAMBE is a per bank CAM energy per cycle, p is a false positive probability, and V2 is a voltage reduction factor achieved due to lowering the frequency and the voltage of a CAM bank per cycle.

* * * * *

UNITED STATES PATENT AND TRADEMARK OFFICE
CERTIFICATE OF CORRECTION

PATENT NO. : 8,917,530 B2  
APPLICATION NO. : 13/747166  
DATED : December 23, 2014  
INVENTOR(S) : Tolga Soyata It is certified that error appears in the above-identified patent and that said Letters Patent is hereby corrected as shown below:

In the Specification

Col. 2, line 53, please delete "CAMBE*B*(1-(V2*(1+p*(B-1)))>>B*BFE" and replace with --CAMBE*B*(1-(V2*(1+p*(B-1))/B)>>B*BFE--

Signed and Sealed this
Fourteenth Day of April, 2015

Michelle K. Lee
*Director of the United States Patent and Trademark Office*